(12) United States Patent
Geng et al.

(10) Patent No.: US 11,950,013 B2
(45) Date of Patent: Apr. 2, 2024

(54) METHOD FOR PROCESSING AN IMAGE FRAME AND ELECTRONIC DEVICE

(71) Applicant: BOE TECHNOLOGY GROUP CO., LTD., Beijing (CN)

(72) Inventors: Lihua Geng, Beijing (CN); Xitong Ma, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 300 days.

(21) Appl. No.: 17/482,605

(22) Filed: Sep. 23, 2021

(65) Prior Publication Data

US 2022/0103871 A1    Mar. 31, 2022

(30) Foreign Application Priority Data

Sep. 25, 2020    (CN) .......................... 202011026511.2

(51) Int. Cl.
*H04N 5/268*    (2006.01)
*H03M 13/09*    (2006.01)

(52) U.S. Cl.
CPC ............ *H04N 5/268* (2013.01); *H03M 13/09* (2013.01)

(58) Field of Classification Search
CPC ................. H04N 5/268; H04N 21/816; H04N 21/43632; H04N 17/00; H04N 25/68; H03M 13/09
See application file for complete search history.

(56) References Cited

U.S. PATENT DOCUMENTS

| 2007/0202842 | A1* | 8/2007 | Shao ...................... | H04N 19/89 |
| | | | | 375/E7.279 |
| 2013/0271798 | A1* | 10/2013 | Nakamura ............... | H04N 1/40 |
| | | | | 358/463 |
| 2017/0095137 | A1* | 4/2017 | Kinouchi ............ | A61B 1/00055 |
| 2021/0303248 | A1* | 9/2021 | Nakai ................. | G06F 3/04817 |

* cited by examiner

*Primary Examiner* — Thien Nguyen
(74) *Attorney, Agent, or Firm* — Dority & Manning, P.A.

(57) ABSTRACT

A method for processing an image frame includes: obtaining an image frame to be displayed; determining whether pixel data in the image frame to be displayed is lost; and using preset replacement data as data of target pixels in the image frame to be displayed, in response to determining that the pixel data in the image frame to be displayed is lost.

12 Claims, 6 Drawing Sheets

METHOD FOR PROCESSING AN IMAGE FRAME AND ELECTRONIC DEVICE

CROSS-REFERENCE TO RELATED APPLICATION

This application claims priority to Chinese Patent Application No. 202011026511.2, filed on Sep. 25, 2020, which is incorporated herein by reference in its entirety.

TECHNICAL FIELD

The present disclosure relates to the field of display technologies of ultra-high resolution, and in particular, to a method for processing an image frame, and electronic devices.

BACKGROUND

Serial digital interfaces (SDIs) are widely used in a variety of scenarios for image transmission. According to different image transmission rates, the SDIs may be classified into standard definition SDI (SD-SDI), high definition SDI (HD-SDI), 3G-SDI, 6G-SDI and 12G-SDI. For example, image transmission rates of SD-SDI, HD-SDI and 3G-SDI may be 270 Mb/s, 1.485 Gb/s and 2.97 Gb/s, respectively. Generally, a monitor with a high resolution may transmit a 4K image or an 8K image through SDI (e.g., 3G-SDI or 12G-SDI) of a high image transmission rate.

The 4K image refers to an image having or approximately having 4096 pixels in each row in a horizontal direction regardless of an aspect ratio of the image. The 4K image belongs to an ultra-high definition image, and its resolution may be a product of 4096 and 2106 (4096×2160), under which viewers can see every detail in the image clearly. Resolution of the 8K image is 4 times (2 times in both length and width) the resolution of the 4K image.

SUMMARY

In an aspect, a method for processing an image frame is provided. The method includes: obtaining an image frame to be displayed; determining whether pixel data in the image frame to be displayed is lost; and using preset replacement data as data of target pixels in the image frame to be displayed, in response to determining that the pixel data in the image frame to be displayed is lost.

In some embodiments, the image frame to be displayed includes M pixel arrays, and M is an integer greater than 1; and determining whether the pixel data in the image frame to be displayed is lost includes determining whether pixel data in each of the M pixel arrays is lost.

In some embodiments, each pixel array is composed of pixels with a same mark, and the image frame to be displayed is obtained by arranging pixels in the M pixel arrays in a two-sample interleave manner.

In some embodiments, determining whether the pixel data in each pixel array is lost includes: checking a cyclic redundancy check (CRC) code in data of each row of pixels in the pixel array; determining whether a ratio of a number of first pixel rows to a number of second pixel rows in the pixel array is greater than or equal to a first threshold value; and determining that the pixel data in the pixel array is lost in response to determining that the ratio of the number of the first pixel rows to the number of the second pixel rows in the pixel array is greater than or equal to the first threshold value, so as to determine that the pixel data in the image frame to be displayed is lost. The number of first pixel rows is a number of pixel rows that fail to pass the CRC code check in the pixel array, and the number of second pixel rows is a total number of pixel rows in the pixel array.

In some embodiments, using the preset replacement data as the data of the target pixels in the image frame to be displayed includes: using replacement data corresponding to the pixel array as the data of the target pixels. The target pixels are all or part of pixels in the pixel array, or the target pixels are all pixels in the image frame to be displayed.

In some embodiments, the replacement data corresponding to the pixel array includes data corresponding to pixels of a predetermined color and/or data used for displaying the mark of the pixels in the pixel array.

In some embodiments, the method further includes: counting a number of image frames in which pixel data is continuously lost; determining whether the number of image frames in which the pixel data is continuously lost is greater than or equal to a second threshold value; and using preset replacement data as data of at least part of pixels in each image frame in which the pixel data is continuously lost, in response to determining that the number of image frames in which the pixel data is continuously lost is greater than or equal to the second threshold value.

In some embodiments, the method further includes: detecting a connection state of a target SDI, the target SDI being configured to transmit data of at least one pixel array of the image frame to be displayed; and using preset replacement data as the data of the at least one pixel array transmitted by the target SDI, in response to detecting that the target SDI is in an abnormal connection state.

In another aspect, an electronic device is provided. The electronic device includes a processor. The processor is configured to: obtain an image frame to be displayed; determine whether pixel data in the image frame to be displayed is lost; and use preset replacement data as data of target pixels in the image frame to be displayed, in response to determining that the pixel data in the image frame to be displayed is lost.

In some embodiments, the image frame to be displayed includes M pixel arrays, and M is an integer greater than 1; and the processor is configured to determine whether the pixel data in the image frame to be displayed is lost includes: the processor is configured to determine whether pixel data in each of the M pixel arrays is lost.

In some embodiments, each pixel array is composed of pixels with a same mark, and the image frame to be displayed is obtained by arranging pixels in the M pixel arrays in a two-sample interleave manner.

In some embodiments, the processor is configured to determine whether the pixel data in each pixel array is lost includes the processor is further configured to: check a CRC code in data of each row of pixels in the pixel array; determine whether a ratio of a number of first pixel rows to a number of second pixel rows in a pixel array is greater than or equal to a first threshold value; and determine that the pixel data in the pixel array is lost in response to determining that the ratio of the number of the first pixel rows to the number of the second pixel rows in the pixel array is greater than or equal to the first threshold value, so as to determine that the pixel data in the image frame to be displayed is lost. The number of first pixel rows is a number of pixel rows that fail to pass the CRC code check in the pixel array, and the number of second pixel rows is a total number of pixel rows in the pixel array.

In some embodiments, the processor is configured to use the preset replacement data as the data of the target pixels in the image frame to be displayed includes the processor is configured to use replacement data corresponding to the pixel array as the data of the target pixels. The target pixels are all or part of pixels in the pixel array, or the target pixels are all pixels in the image frame to be displayed.

In some embodiments, the replacement data corresponding to the pixel array includes data corresponding to pixels of a predetermined color and/or data used for displaying the mark of the pixels in the pixel array.

In some embodiments, the processor is further configured to: count a number of image frames in which pixel data is continuously lost; determine whether the number of image frames in which the pixel data is continuously lost is greater than or equal to a second threshold value; and use preset replacement data as data of at least part of pixels in each image frame in which the pixel data is continuously lost, in response to determining that the number of image frames in which the pixel data is continuously lost is greater than or equal to the second threshold value.

In some embodiments, the processor is further configured to: detect a connection state of a target SDI, the target SDI being configured to transmit data of at least one pixel array of the image frame to be displayed; and use preset replacement data as the data of the at least one pixel array transmitted by the target SDI, in response to detecting that the target SDI is in an abnormal connection state.

In some embodiments, the electronic device further includes a memory coupled to the processor. The memory is configured to store image frames to be displayed.

In some embodiments, the electronic device further includes a display panel coupled to the processor. The display panel is configured to display image frames to be displayed.

In yet another aspect, an electronic device is provided. The electronic device includes a memory and a processor. The memory stores a computer program that, when executed by the processor, causes the processor to perform the method for processing the image frame as described in any of the above embodiments.

In yet another aspect, a non-transitory computer-readable storage medium is provided. The non-transitory computer-readable storage medium stores a computer program that, when executed by a processor, causes the processor to perform the method for processing the image frame as described in any of the above embodiments.

BRIEF DESCRIPTION OF THE DRAWINGS

In order to describe technical solutions in some embodiments of the present disclosure more clearly, accompanying drawings to be used in some embodiments will be introduced briefly below. However, the accompanying drawings to be described below are merely accompanying drawings of some embodiments of the present disclosure, and a person of ordinary skill in the art can obtain other drawings according to these drawings.

DETAILED DESCRIPTION

Figure 1:
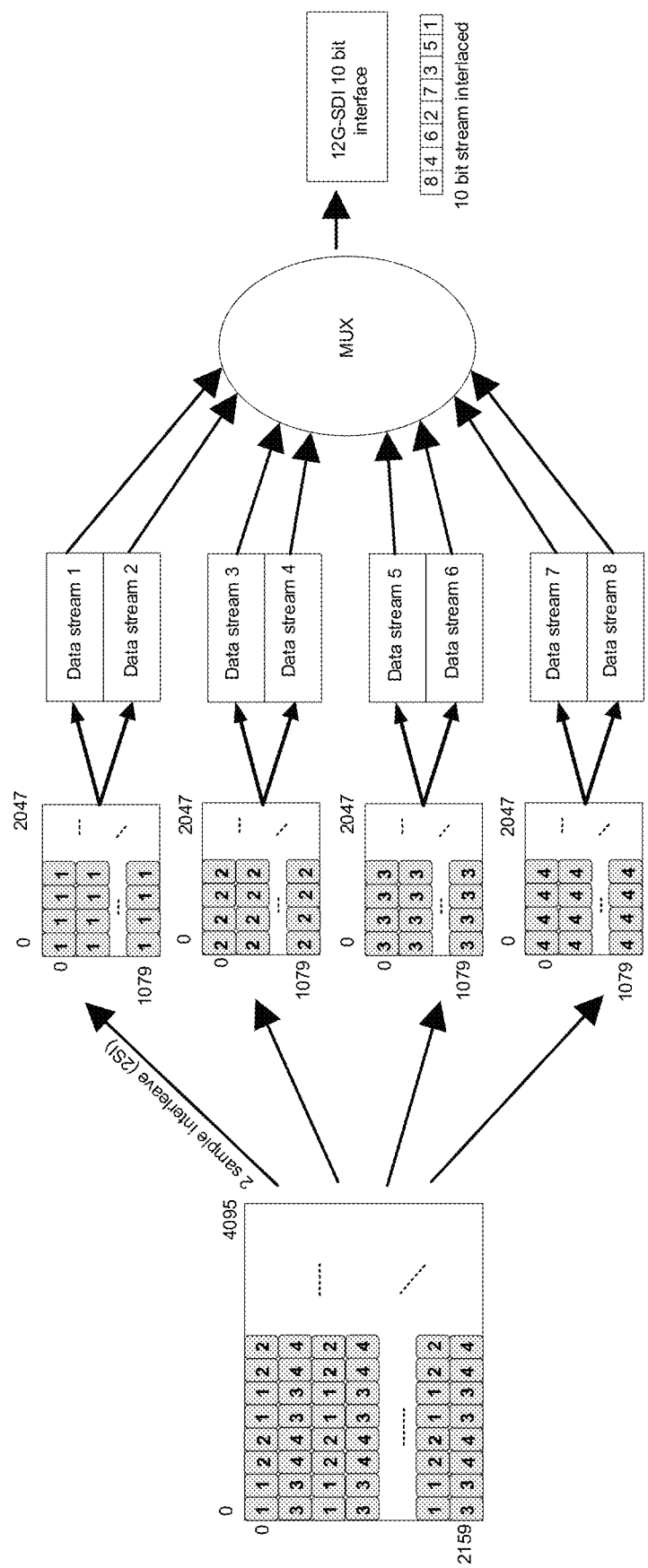
FIG. 1 is a schematic diagram showing an image segmentation of a 4K image transmitted through a 12G-SDI.

Technical solutions in some embodiments of the present disclosure will be described clearly and completely below with reference to accompanying drawings. However, the described embodiments are merely some but not all embodiments of the present disclosure. All other embodiments obtained by a person of ordinary skill in the art on a basis of the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as open and inclusive meanings, i.e., "including, but not limited to."

In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics may be included in any one or more embodiments or examples in any suitable manner.

Hereinafter, the terms "first" and "second" are used for descriptive purposes only, and are not to be construed as indicating or implying relative importance or implicitly indicating the number of indicated technical features. Thus, a feature defined with "first" or "second" may explicitly or implicitly include one or more of the features. In the description of the embodiments of the present disclosure, the term "a plurality of/the plurality of" means two or more unless otherwise specified.

In the description of some embodiments, the terms "coupled" and "connected" and their derivatives may be used. For example, the term "connected" may be used in the description of some embodiments to indicate that two or more components are in direct physical or electrical contact with each other. For another example, the term "coupled" may be used in the description of some embodiments to indicate that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the contents herein.

The phrase "A and/or B" includes the following three combinations: only A, only B, and a combination of A and B.

As used herein, the term "if" is optionally construed as "when" or "in a case where" or "in response to determining that" or "in response to detecting", depending on the context. Similarly, the phrase "if it is determined that" or "if [a stated condition or event] is detected" is optionally construed as "in a case where it is determined that" or "in response to determining that" or "in a case where [the stated condition or event] is detected" or "in response to detecting [the stated condition or event]", depending on the context.

The use of the phrase "configured to" herein means an open and inclusive expression, which does not exclude devices that are configured to perform additional tasks or steps.

Figure 2:
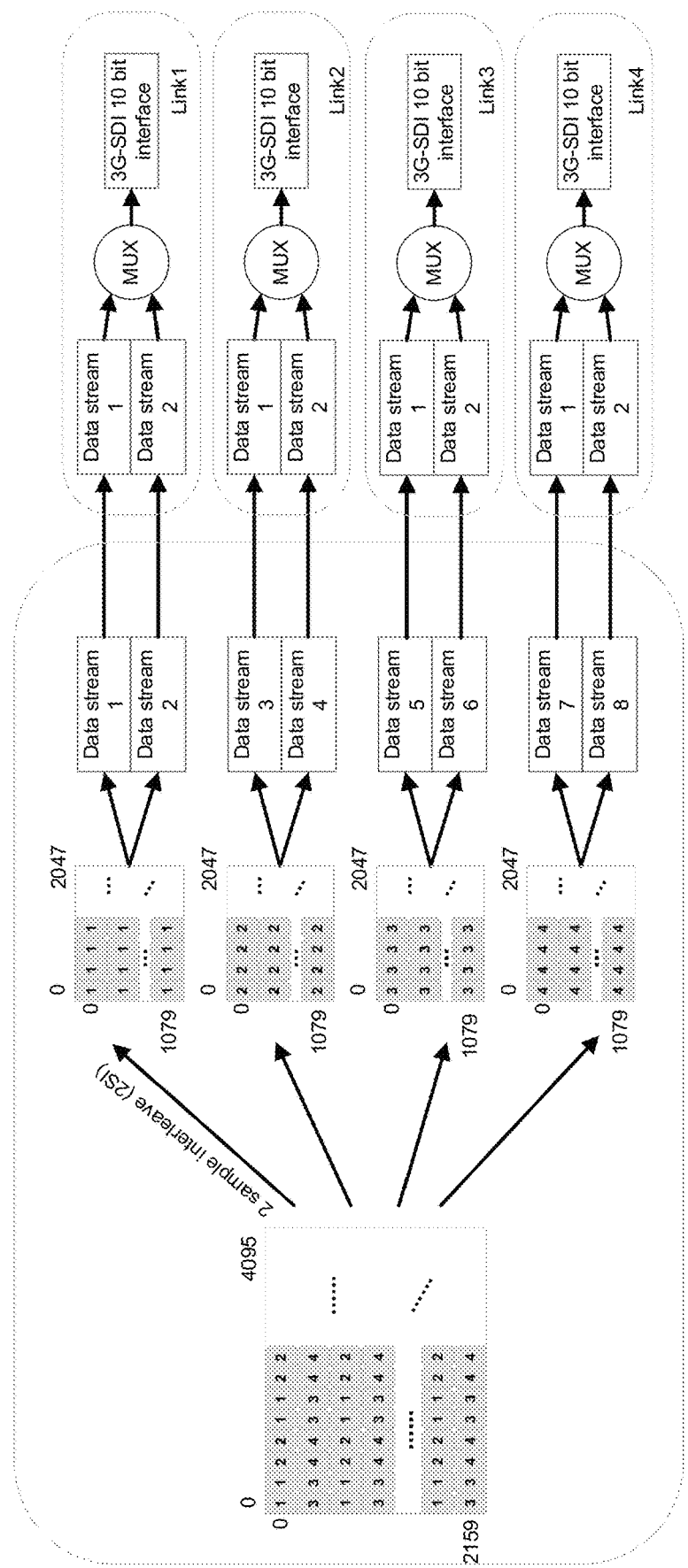
FIG. 2 is a schematic diagram showing an image segmentation of a 4K image transmitted through four 3G-SDIs.

According to a serial digital interface (SDI) signal protocol, pixels of a 4K image and an 8K image may be segmented in a two-sample interleave (2SI) manner. For example, FIG. 1 illustrates an image segmentation of a 4K image when the 4K image is transmitted through a single 12G-SDI, and FIG. 2 illustrates an image segmentation of a 4K image when the 4K image is transmitted through four 3G-SDIs. As shown in FIGS. 1 and 2, pixels (4096×2160 pixels) of the 4K image may be segmented in the 2SI manner. For example, the pixels marked as 1, 2, 3, and 4 in the 4K image are rearranged as four 2K images (each having 2048×1080 pixels), and then each 2K image is transmitted through a single link. As shown in FIG. 1, four links may combine into a single data stream to be transmitted through the single 12G-SDI. As shown in FIG. 2, four links are each transformed into a single data stream to be transmitted through the four 3G-SDIs.

In a process of transmitting the 4K image through the 12G-SDI or the 3G-SDIs, there may be some problems such as a loss of pixel data on a certain link when the 4K image is transmitted through the 12G-SDI, or a certain 3G-SDI in the four 3G-SDIs not being correctly connected when the 4K image is transmitted through the four 3G-SDIs. Wrong connection will result in a loss of pixel data. In general, pixels whose data is lost during transmission are scattered in the 4K image, and a single pixel occupies a small space in the image. Therefore, the loss of the pixel data transmitted by the certain link may not have an influence on integrity of the image displayed by a display device (e.g., a display screen). However, as shown in FIG. 3, if pixel data (e.g., data of pixels marked as 2 shown in FIG. 3) on the certain link is continuously lost, the display effect of the entire image, such as brightness or local details of the image, will be affected, resulting in poor quality of the displayed image.

Some embodiments of the present disclosure provide a method for processing an image frame. The method may be applied to an electronic device with SDI(s), such as a 4K monitor or display device with SDI(s), or an 8K monitor or display device with SDI(s).

Figures 3, 4:
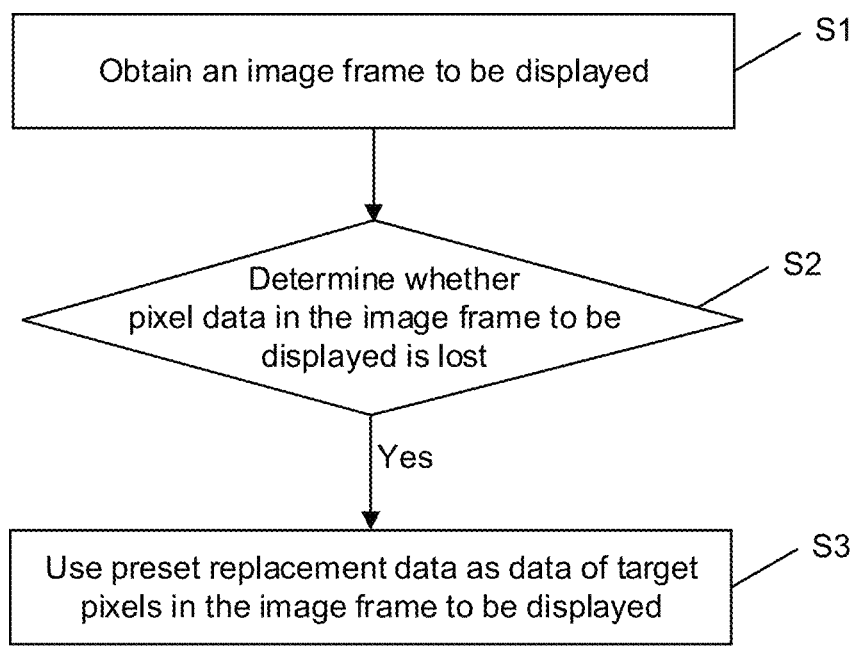
FIG. 3 is schematic diagram showing a loss of pixel data in a 4K image.
FIG. 4 is a schematic flowchart of a method for processing an image frame, in accordance with some embodiments of the present disclosure.

As shown in FIG. 4, the method includes steps 1 to 3 (S1 to S3).

In S1, an image frame to be displayed is obtained.

In some examples, the electronic device may obtain the pixel data of the image frame to be displayed through the SDI(s).

For example, an image frame to be displayed corresponding to the 4K image is transmitted through the 12G-SDI. A data stream transmitted to the electronic device through the 12G-SDI is divided into four data streams according to a reverse process in FIG. 1, and links corresponding to different data streams are used for transmitting data of pixel arrays with different pixel marks in the 4k image. That is to say, each data stream is used for transmitting data of one pixel array. The pixel arrays with the different pixel marks includes, for example, four pixel arrays composed of pixels marked as 1, 2, 3, and 4. The image frame to be displayed corresponding to the 4K image may be obtained after the pixels included in the four pixel arrays are arranged in the 2SI manner. The electronic device (e.g., the display device or the monitor) may detect the image frame to be displayed before displaying the image frame, so as to determine whether pixel data in the image frame to be displayed is lost. In this way, it is convenient to process the image frame to be displayed timely after it is determined that the pixel data in the image frame to be displayed is lost.

In S2, it is determined whether pixel data in the image frame to be displayed is lost.

In some embodiments, after the electronic device obtains the image frame to be displayed, the electronic device may detect whether pixel data in the image frame to be displayed is lost, so as to determine how to display the image frame to be displayed.

In a case where the pixel data in the image frame to be displayed is not lost, the electronic device may directly display the image frame to be displayed. In a case where the pixel data in the image frame to be displayed is lost, the electronic device may use preset replacement data as data of at least part of pixels (e.g., target pixels in embodiments of the present disclosure) in the image frame to be displayed. That is, the electronic device may perform the following step 3 (S3).

In S3, preset replacement data is used as data of target pixels in the image frame to be displayed.

In some embodiments, the target pixels may be part or all of the pixels in the image frame to be displayed.

In the case where the electronic device determines that the pixel data in the image frame to be displayed is lost, the electronic device may use the preset replacement data as the data of the target pixels, so as to remind a user of the loss of the pixel data in the displayed image frame. In this way, the user may timely troubleshoot the transmission link(s) for transmitting the image frame, thereby avoiding loss of pixel data in an image frame displayed by the electronic device for a long time.

In some examples, the image frame to be displayed includes M pixel arrays, and M is an integer greater than 1. For example, for each 4K image, each image frame includes four pixel arrays. Based on this, S2 may be implemented by the following step 2a (S2a).

In S2a, it is determined whether pixel data in each of the M pixel arrays is lost.

In some embodiments, each pixel array is composed of pixels with the same mark, and the image frame to be displayed is obtained by arranging pixels in the M pixel arrays in the 2SI manner. The data of the pixels with the same mark are transmitted through the same link.

That is to say, for each 4K image, each image frame is obtained by arranging pixels included in the four pixel arrays in the 2SI manner, and pixels in each pixel array are marked using the same mark. Therefore, it is possible to determine whether the pixel data in each pixel array is lost by detecting marks of all pixels in the image frame to be displayed, thereby, determining whether the pixel data in the image frame to be displayed is lost.

In the SDI transmission protocol, a cyclic redundancy check (CRC) code may be added in data of each row of pixels in the pixel array. After receiving data of the pixel array, the electronic device may determine whether a transmission error occurs in the row of pixels corresponding to the CRC code by checking the CRC code. Therefore, when it is determined whether the pixel data in the image frame to be displayed is lost, the electronic device may check the CRC code of each row of pixels in each pixel array in the image frame to be displayed. If a CRC code corresponding to a certain row of pixels passes the check, it can be determined that no data loss occurs in a process of transmitting data of the row of pixels. That is, no data loss in the row of pixels is lost. If a CRC code corresponding to a certain row of pixels fails to pass the check, it can be determined that a data loss occurs in a process of transmitting data of the row of pixels. That is, data in the row of pixels is lost.

For example, if transmission errors only occur in a very few pixel rows in a pixel array of 2048×1080, it is possible to neglect the effect caused thereby on the entire image frame. In this case, failure of the check of the CRC code of the pixel rows may be considered to be caused by unstable network transmission, rather than problems existing in the SDI. Therefore, it cannot be considered that data in the pixel array or the image frame, in which the pixel rows are located misses, is lost.

In some embodiments, S2a may be implemented by steps 2a1 to 2a3 (S2a1 to S2a3).

In S2a1, a CRC code in data of each row of pixels in each pixel array is checked.

In S2a2, it is determined whether a ratio of a number of first pixel rows to a number of second pixel rows in each pixel array is greater than or equal to a first threshold value.

In S2a3, if the ratio of the number of first pixel rows to the number of second pixel rows in the pixel array is greater than or equal to the first threshold value, it is determined that the pixel data in the pixel array is lost, so as to determine that the pixel data in the image frame to be displayed is lost.

The number of first pixel rows may be a number of pixel rows that fail to pass the CRC code check in the pixel array, and the number of second pixel rows may be a total number of pixel rows in the pixel array.

For example, if the pixel array is a pixel array of 2048×1080, the number of second pixel rows may be 1080.

It will be understood that, if the ratio of the number of first pixel rows to the number of second pixel rows is less than the first threshold value, it is determined that no pixel data in the pixel array is lost. That is, it is determined that no pixel data in the image frame to be displayed is lost.

In the embodiments of the present disclosure, it is possible to determine whether the pixel data in the pixel array is lost by counting the number of pixel rows that fail to pass the check. When the CRC code corresponding to each row of pixels in the pixel array is checked, the number of pixel rows that fail to pass the check in the target array is recorded as the number of first pixel rows; and then the ratio of the number of first pixel rows to the total number of pixel rows (the number of second pixel rows) in the pixel array is calculated. After the ratio of the number of first pixel rows to the number of second pixel rows is determined, the electronic device may determine whether the ratio is greater than or equal to the first threshold value. If the ratio is greater than or equal to the first threshold value, it is determined that a ratio of the number of pixel rows with transmission errors to the total number of pixel rows in the pixel array exceeds a certain ratio. Therefore, it is determined that the loss of pixel data in the pixel array is not caused by the instability of the network, but is caused by a fault in a link corresponding to the pixel array, and in turn, it is determined that the pixel data is lost in the image frame to be displayed.

In some examples, the first threshold value is set according to the number of pixels of the pixel array or an actual display condition of the electronic device. For example, the first threshold value is set to 60% or 70%. That is to say, in a case where the number of pixel rows that fail to pass the check in the pixel array is greater than or equal to 60% or 70% of the total number of pixel rows in the pixel array, the electronic device determines that there may be a fault in the link corresponding to the pixel array, which results in the loss of the pixel data in the image frame to be displayed.

In some examples, based on S2a1 to S2a3, S3 is implemented by step 3a (S3a).

In S3a, replacement data corresponding to the pixel array is used as the data of the target pixels.

For example, the target pixels are all or part of the pixels in the pixel array. For another example, the target pixels are all of the pixels in the image frame to be displayed.

In some embodiments, after it is determined that the pixel data in the image frame to be displayed is lost, the electronic device may use the replacement data corresponding to the pixel array as data of at least part of the pixels in the image frame to be displayed. For example, the at least part of the pixels in the image frame are all or part of the pixels in the pixel array. For another example, the at least part of the pixels in the image frame are all of the pixels in the image frame to be displayed. In this way, after the electronic device displays the image frame, it is possible to remind the user that there is a problem with the image frame, and the SDI needs to be troubleshot and overhauled, thereby avoiding that a certain link may be in a long-term fault status.

In some embodiments, the image frame to be displayed includes M pixel arrays, and pixel data in at least one pixel array in the M pixel arrays is lost. The electronic device may use the replacement data corresponding to the pixel array with the loss of the pixel data as the data of the target pixels in the image frame to be displayed, thereby reminding the user which link or which SDI has a fault. In this way, it is convenient for the user to carry out troubleshooting and maintenance in a targeted manner.

In some embodiments, the replacement data corresponding to the pixel array includes data corresponding to pixels of a predetermined color, and/or data used for displaying the mark of the pixels in the pixel array.

In some examples, different pixel arrays correspond to different replacement data. In this way, after the data of the target pixels is replaced with the replacement data, it is possible to indicate clearly which pixel array loses the pixel data, thereby indicating clearly which link or which SDI has a fault. That is, the replacement data may have an indicative function. For example, the predetermined color is used to indicate the pixel array with the loss of the pixel data, or the mark of the pixels is used to indicate the pixel array with the loss of the pixel data.

In a case where the predetermined color is used to indicate the pixel array with the loss of the pixel data, the user may determine which pixel array is the pixel array with the loss of the pixel data through a color ultimately displayed on the electronic device when the electronic device displays the image frame to be displayed.

In some examples, replacement data corresponding to a pixel array in which pixels are marked as 1 is data corresponding to yellow pixels, replacement data corresponding to a pixel array in which pixels are marked as 2 is data corresponding to blue pixels, replacement data corresponding to a pixel array in which pixels are marked as 3 is data corresponding to green pixels, and replacement data corresponding to a pixel array in which pixels are marked as 4 is data corresponding to red pixels.

In a case where pixel data in the pixel array in which the pixels are marked as 1 are lost, the electronic device may use the data corresponding to the yellow pixels as data of all pixels in the pixel array in which the pixels are marked as 1. That is to say, even if there are pixels with correct transmission in the pixel array in which the pixels are marked as 1, data of the pixels with correct transmission is also replaced by the data of the yellow pixels, so that the image finally displayed is relatively yellow. Therefore, when the user notices that the image displayed by the electronic device is relatively yellow, it may be determined that the pixel data in the pixel array in which the pixels are marked as 1 is lost. In this way, the link or the SDI used for transmitting the pixel array in which the pixels are marked as 1 may be overhauled directly.

In a case where pixel data in two pixel arrays in the image frame to be displayed is lost, the electronic device may use pixel data corresponding different colors as data of pixels in the two pixel arrays with the loss of the pixel data in the image frame to be displayed.

For example, if there is the loss of the pixel data in the pixel array in which the pixels are marked as 1 and the pixel array in which the pixels are marked as 4 in the image frame to be displayed, data of the yellow pixels may be used as data of all or part of the pixels in the pixel array in which the pixels are marked as 1, and data of the red pixels may be used as data of all or part of the pixels in the pixel array in which the pixels are marked as 4. In this way, the image finally displayed is a mixed color of red and yellow.

In the above examples, when the pixel data in the pixel array in the image frame to be displayed is lost, the electronic device may use the data of the pixels of the predetermined color(s) as data of all or part of the pixels in the image frame to be displayed, so that the electronic device does not display content corresponding to the image frame to be displayed, and only displays corresponding color(s), which may achieve an obvious prompting effect.

In a case where the data used for displaying the mark of the pixels in the pixel array is used as the data of the target pixels, the user may determine which pixel array is the pixel array with the loss of the pixels through the mark(s) finally displayed on the electronic device.

Figure 5:
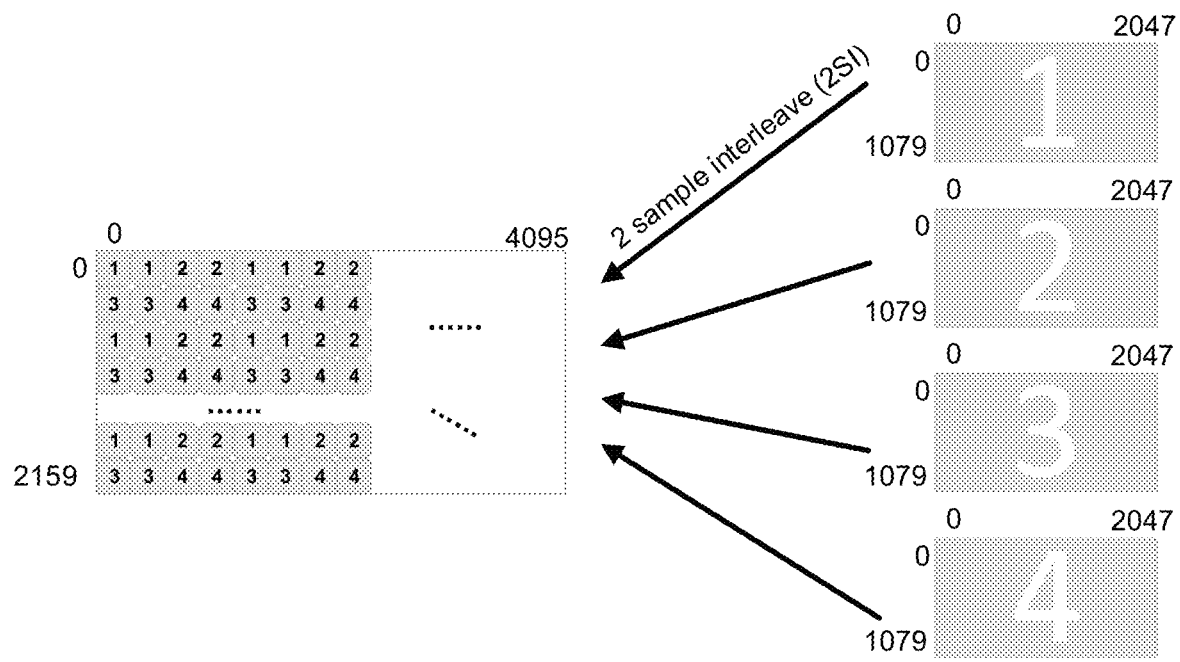
FIG. 5 is a schematic diagram of displayed marks corresponding to pixel arrays, in accordance with some embodiments of the present disclosure.
Figure 6:
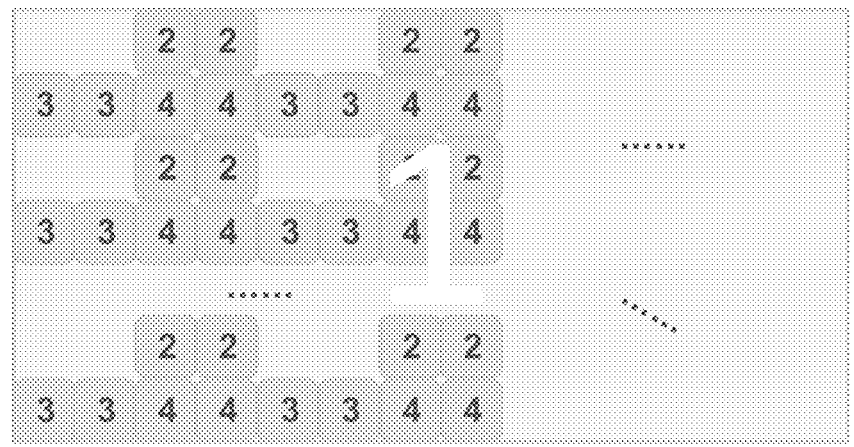
FIG. 6 is a schematic diagram of an image frame after replacement data is used as data of target pixels, in accordance with some embodiments of the present disclosure.

For example, FIG. 5 illustrates displayed marks corresponding to pixel arrays. The displayed mark 1 corresponds to the pixel array in which the pixels are marked as 1, the displayed mark 2 corresponds to the pixel array in which the pixels are marked as 2, the displayed mark 3 corresponds to the pixel array in which the pixels are marked as 3, and the displayed mark 4 corresponds to the pixel array in which the pixels are marked as 4. For example, if the pixel data in the pixel array in which the pixels are marked as 1 is lost, the electronic device may use the data used for displaying the mark 1 as the data of the target pixels in the image frame to be displayed. In this case, the image displayed by the electronic device may be shown as FIG. 6, which may remind the user that the pixel data in the pixel array in which the pixels are marked as 1 is lost.

In some embodiments, if pixel data in two or more pixel arrays in the image frame to be displayed is lost, the electronic device may display marks corresponding to the pixel arrays in different positions of the image after segmenting the image frame to be displayed.

Figure 7:
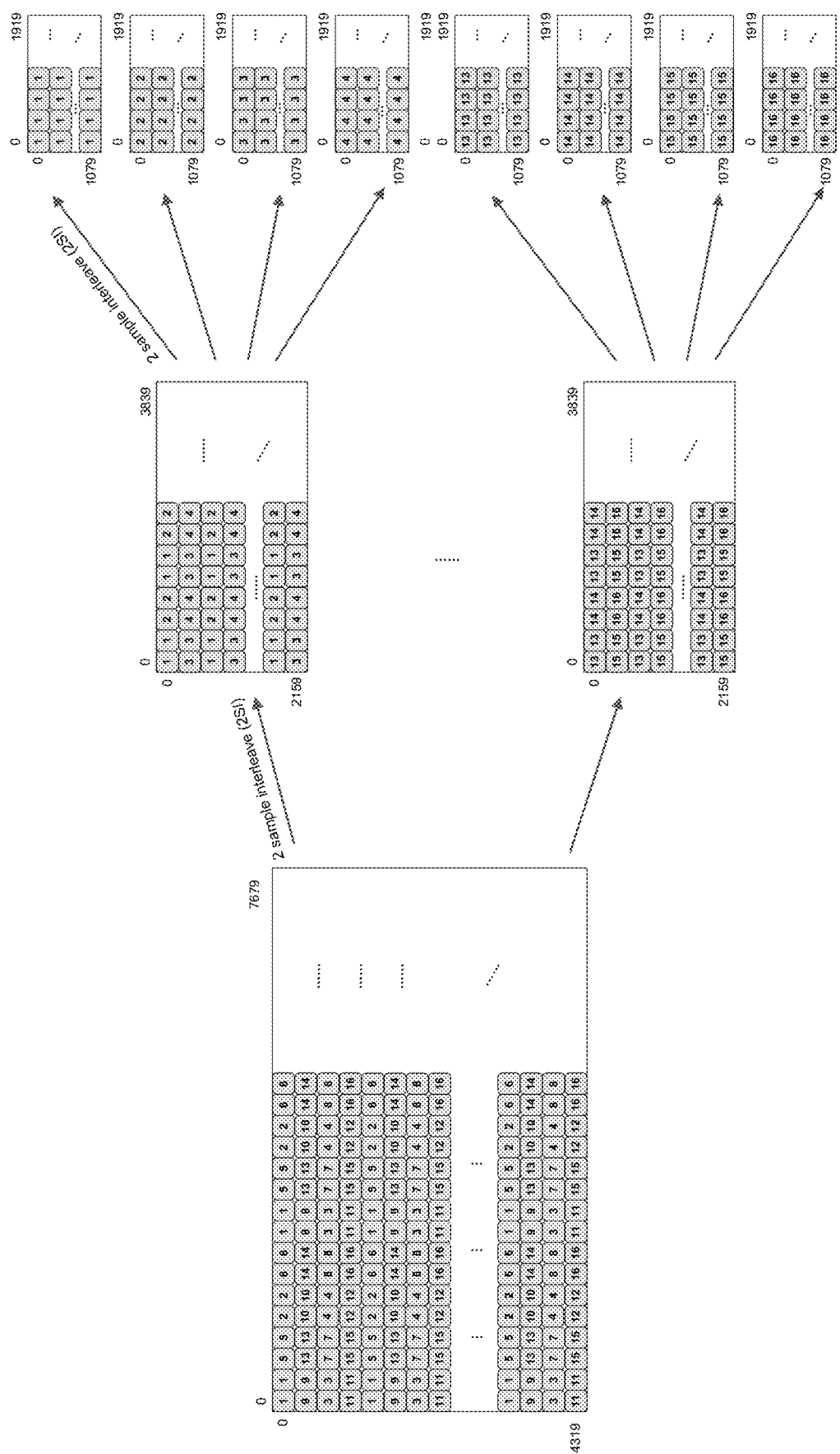
FIG. 7 is a schematic diagram showing image segmentation of an 8K image in the 8K image transmission process.

It will be noted that the 4K image may be composed of the four pixel arrays with different marks. When the pixel data of the predetermined color is used as the replacement data of each pixel array, all links that transmit the image frame to be displayed may be classified through four different colors. For the 8K image, the 8K image is first segmented into four 4K images based on the 2SI protocol in the transmission process, and then each 4K image is segmented into four pixel arrays (as shown in FIG. 7). That is, the 8K image is composed of sixteen pixel arrays with different marks. FIG. 7 only illustrates two of four 4K images and pixel arrays corresponding to the two 4K images.

The data used for displaying the mark corresponding to the pixel array may be used as the replacement data; or, the colors are combined with the marks. For example, colors corresponding to replacement data of four pixel arrays with pixel marks 1, 2, 3 and 4 are set as yellow, colors corresponding to replacement data of four pixel arrays with pixel marks 5, 6, 7 and 8 are set as blue, colors corresponding to replacement data of four pixel arrays with pixel marks 9, 10, 11 and 12 are set as green, and colors corresponding to replacement data of four pixel arrays with pixel marks 13, 14, 15 and 16 are set as red. If pixel data in a certain pixel array is lost, the electronic device may use data including data used for displaying the mark corresponding to the pixel array and data of a color corresponding to the pixel array as the replacement data.

In some embodiments of the present disclosure, the method for processing the image frame further includes steps 4 to 6 (S4 to S6).

In S4, a number of image frames in which pixel data is continuously lost are counted.

In S5, it is determined whether the number of image frames in which the pixel data is continuously lost is greater than or equal to a second threshold value.

In S6, if the number of image frames in which the pixel data is continuously lost is greater than or equal to the second threshold value, the preset replacement data is used as data of at least part of pixels in each image frame in which the pixel data is continuously lost.

In some examples, the SDI simultaneously transmits a dozen or even dozens of image frames in each second. When the pixel data in only one image frame is lost, this situation may be caused by a sudden network fault, and it is not determined that there is a problem with the link of the SDI. Therefore, each image frame transmitted by the SDI may be detected, and the number of image frames in which the pixel data is continuously lost is counted. In a case where the number of the image frames in which the pixel data is continuously lost is greater than or equal to the second threshold value, it is determined that a certain link in the SDI may have a transmission problem continuously. Then, the electronic device may use the above predetermined replacement data as the data of part of the pixels in each image frame in which the pixel data is continuously lost. In this case, it is possible to avoid wrong reminding that occurs in a case where the pixel data in the image frame is suddenly lost due to the network rather than a fault of the SDI, thereby improving accuracy of reminding.

In some embodiments of the present disclosure, the method for processing the image frame further includes steps 7 and 8 (S7 and S8).

In S7, a connection state of a target SDI is detected.

The target SDI may be configured to transmit data of at least one pixel array of the image frame to be displayed.

In S8, if the target SDI is in an abnormal connection state, the preset replacement data is used as the data of the at least one pixel array transmitted by the target SDI.

In some embodiments of the present disclosure, the electronic device determines whether the pixel array corresponding to the received pixel data needs to be processed by checking the connection state of the SDI, before receiving the pixel data transmitted by the SDI.

For example, as shown in FIG. 2, each 3G-SDI may transmit pixel data of an independent pixel array when the 4K image is transmitted through the four 3G-SDIs. The electronic device displays an image according to the pixel data corresponding to each pixel array transmitted by each of the four 3G-SDIs after receiving the pixel data transmitted by the four 3G-SDIs. The electronic device may check connection states of the four 3G-SDIs before receiving the pixel data transmitted by the four 3G-SDIs. When any one (i.e., the above target SDI) of the 3G-SDIs is in an abnormal connection state (e.g., failure of connection or interruption of connection), the electronic device may determine that the 3G-SDI is unable to normally transmit corresponding pixel data. Therefore, it is determined that pixel data in the 4K image received by the electronic device is lost.

In this case, the electronic device may use the preset replacement data as the data of the pixel array transmitted by the 3G-SDI, so as to remind the user that the 3G-SDI is in the abnormal connection state. It is convenient for user to conduct corresponding troubleshooting and maintenance, so that a situation where the pixel data in the displayed image frame is lost for a long time may be avoided.

In the embodiments, the preset replacement data may be used as the data of the pixel array in the image frame to be displayed when it is determined that the pixel data in the image frame to be displayed is lost, thereby reminding the user that the pixel data in the displayed image frame is lost through the display effect of the processed image. Therefore, the SDI may be troubleshot, or the data link may be detected timely. In addition, since the replacement data corresponds to the pixel array, the above reminding may be more targeted. That is, it may be possible to clearly remind the user that which link or which SDI has a fault, so that the user may conduct corresponding troubleshooting and maintenance.

Some embodiments of the present disclosure provide an electronic device. The electronic device may be a 4K or 8K monitor with SDI(s), a 4K or 8K display device with SDI(s), or other devices with SDIs.

Figure 8:
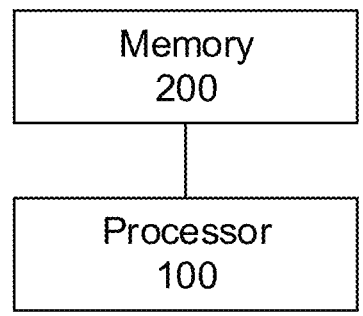
FIG. 8 is a block diagram showing a structure of an electronic device, in accordance with some embodiments of the present disclosure.
Figure 9:
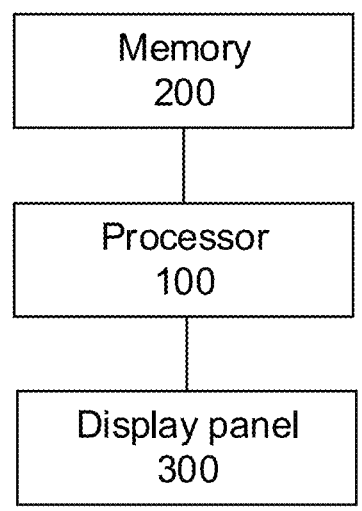
FIG. 9 is a block diagram showing a structure of another electronic device, in accordance with some embodiments of the present disclosure.

In some embodiments, referring to FIGS. 8 and 9, the electronic device includes a processor 100.

It will be noted that the processor 100 may be a general purpose central processing unit (CPU), a microprocessor, an application specific integrated circuit (ASIC), or one or more integrated circuits, which can be selected according to actual application requirements, and is not limited in the embodiments of the present disclosure.

The processor 100 is configured to: obtain an image frame to be displayed; determine whether pixel data in the image frame to be displayed is lost; and if the pixel data in the image frame to be displayed is lost, use preset replacement data as data of target pixels in the image frame to be displayed.

In some examples, the image frame to be displayed includes M pixel arrays, and M is an integer greater than 1. In this case, the processor 100 is configured to determine whether pixel data in each of the M pixel arrays is lost.

In some examples, each pixel array is composed of pixels with the same mark, and the image frame to be displayed is obtained by arranging the pixels in the M pixel arrays in the 2SI manner. The data of the pixels with the same mark are transmitted through the same link.

In some examples, the processor 100 is further configured to: check a CRC code in data of each row of pixels in each pixel array; determine whether a ratio of a number of first pixel rows to a number of second pixel rows in each pixel array is greater than or equal to a first threshold value; and if the ratio of the number of first pixel rows to the number of second pixel rows in the pixel array is greater than or equal to the first threshold value, determine that pixel data in the pixel array is lost, so as to determine that the pixel data in the image frame to be displayed is lost.

The number of first pixel rows is a number of pixel rows that fail to pass the CRC code check in the pixel array, and the number of second pixel rows is a total number of pixel rows in the pixel array.

In some examples, the processor 100 is further configured to use replacement data corresponding to the pixel array as the data of the target pixels.

For example, the target pixels are all or part of the pixels in the pixel array. For another example, the target pixels are all the pixels in the image frame to be displayed.

In some examples, the replacement data corresponding to the pixel array includes data corresponding to pixels of a predetermined color and/or data used for displaying the mark of the pixels in the pixel array.

In some examples, the processor 100 is further configured to: count a number of image frames in which pixel data is continuously lost; determine whether the number of image frames in which the pixel data is continuously lost is greater than or equal to a second threshold value; and if the number of image frames in which the pixel data is continuously lost is greater than or equal to the second threshold value, use the preset replacement data as data of at least part of pixels in each image frame in which the pixel data is continuously lost.

In some examples, the processor 100 is further configured to: detect a connection state of a target SDI, the target SDI being configured to transmit data of at least one pixel array of the image frame to be displayed; and if the target SDI is in an abnormal connection state, use the preset replacement data as the data of the at least one pixel array transmitted by the target SDI.

In some embodiments, referring to FIGS. 8 and 9, the electronic device further includes a memory 200 coupled to the processor 100. The memory 200 is configured to store image frames to be displayed.

The memory 200 may be one memory, or may be a collective name of a plurality of storage elements, and is used to store executable program codes, etc. For example, the memory may be a read-only memory (ROM) or another type of static storage device that may store static information and instructions, a random access memory (RAM), or another type of dynamic storage device that may store information and instructions, or an electrically erasable programmable read-only memory (EEPROM), a compact disc read-only memory (CD-ROM) or another compact disc storage, an optical disc storage (including a compressed disc, a laser disc, an optical disc, a digital versatile disc, or Blu-ray disc, etc.), a magnetic disc storage medium or another magnetic storage device, or any other medium that may be used to carry or store a desired program code in the form of instructions or data structures and can be accessed by a computer, which is not limited thereto.

In some embodiments, referring to FIG. 9, the electronic device further includes a display panel 300 coupled to the processor 100. The display panel 300 is configured to display image frames to be displayed. For example, the display panel 300 displays the image frame to be displayed in which the data of the pixel array is the preset replacement data.

In some other embodiments, referring to FIGS. 8 and 9, the electronic device includes a memory 200 and a processor 100. The memory 200 stores one or more computer programs that, when executed by the processor 100, cause the processor 100 to perform the method provided in any one of the embodiments of the present disclosure. For example, the processor 100 performs the following steps 31 to 33 (S31 to S33).

In S31, an image frame to be displayed is obtained.

In S32, it is determined whether pixel data in the image frame to be displayed is lost.

In S33, if the pixel data in the image frame to be displayed is lost, preset replacement data is used as data of target pixels in the image frame to be displayed.

In some embodiments, the image frame to be displayed includes M pixel arrays, and M is an integer greater than 1. The one or more computer programs stored in the memory 200, when executed by the processor 100, cause the processor 100 to determine whether pixel data in each of the M pixel arrays is lost.

In some embodiments, each pixel array is composed of pixels with the same mark, and the image frame to be displayed is obtained by arranging the pixels in the M pixel arrays in the 2SI manner. The pixels with the same mark are transmitted through the same link.

In some embodiments, the one or more computer programs stored in the memory 200, when executed by the processor 100, cause the processor 100 further to: check a CRC code in data of each row of pixels in each pixel array; determine whether a ratio of a number of first pixel rows to a number of second pixel rows in a pixel array is greater than or equal to a first threshold value, and if the ratio of the number of first pixel rows to the number of second pixel rows in the pixel array is greater than or equal to the first threshold value, determine that pixel data in the pixel array is lost, so as to determine that the pixel data in the image frame to be displayed is lost.

The number of first pixel rows is a number of pixel rows that fail to pass the CRC code check in the pixel array, and the number of second pixel rows is a total number of pixel rows in the pixel array.

In some embodiments, the one or more computer programs stored in the memory 200, when executed by the processor 100, cause the processor 100 further to: use replacement data corresponding to the pixel array as the data of the target pixels. For example, the target pixels are all or part of the pixels in the pixel array. For another example, the target pixels are all pixels in the image frame to be displayed.

In some embodiments, the replacement data corresponding to the pixel array includes data corresponding to pixels of a predetermined color and/or data used for displaying the mark of the pixels in the pixel array.

In some embodiments, the one or more computer programs stored in the memory 200, when executed by the processor 100, cause the processor 100 further to: count a number of image frames in which pixel data is continuously lost; determine whether a number of image frames in which the pixel data is continuously lost is greater than or equal to a second threshold value; and if the number of image frames in which the pixel data is continuously lost is greater than or equal to the second threshold value, use the preset replacement data as data of at least part of pixels in each image frame in which the pixel data is continuously lost.

In some embodiments, the one or more computer programs stored in the memory 200, when executed by the processor 100, cause the processor 100 to: detect a connection state of a target SDI, the target SDI being configured to transmit data of at least one pixel array of the image frame to be displayed; and if the target SDI is in an abnormal connection state, use the preset replacement data as the data of the at least one pixel array transmitted by the target SDI.

For the electronic device provided in the embodiments of the present disclosure, the preset replacement data may be used as the data of the pixel array in the image frame to be displayed when it is detected that the pixel data in the image frame to be displayed is lost, thereby reminding the user that the pixel data in the image frame to be displayed is lost through the display effect of the processed images. Therefore, the SDI may be troubleshot, or the data links may be detected timely. In addition, since the replacement data corresponds to the pixel array, the above reminding may be more targeted. That is, it may be possible to clearly remind the user that which link or which SDI has a fault, so that the user may conduct corresponding troubleshooting and maintenance. In this way, a situation where the pixel data in the display image frame to be displayed is lost for a long time may be avoided.

Some embodiments of the present disclosure further provide a non-transitory computer readable storage medium that may be disposed in an electronic device with SDI(s), such as a 4K monitor or display device with SDI(s), or an 8K monitor or display device with SDI(s). The non-transitory computer readable storage medium may store one or more computer programs. When executed by a processor, the one or more computer programs cause the processor to perform the method provided in any one of the embodiments of the present disclosure. The method includes the following steps 31 to 33 (S41 to S43).

In S41, an image frame to be displayed is obtained.

In S42, it is determined whether pixel data in the image frame to be displayed is lost.

In S43, if the pixel data in the image frame to be displayed is lost, preset replacement data is used as data of target pixels in the image frame to be displayed.

In some embodiments, the image frame to be displayed includes M pixel arrays, and M is an integer greater than 1. When the one or more computer programs executed by the processor, cause the processor to further determine whether pixel data in each of the M pixel arrays is lost.

In some embodiments, each pixel array is composed of pixels with the same mark, and the image frame to be displayed is obtained by arranging pixels in the M pixel arrays in the 2SI manner. The data of the pixels with the same mark are transmitted through the same link.

In some embodiments, the one or more computer programs, when executed by the processor, cause the processor further to: check a CRC code in data of each row of pixels in each pixel array, determine whether a ratio of a number of first pixel rows to a number of second pixel rows in each pixel array is greater than or equal to a first threshold value, and if the ratio of the number of first pixel rows to the number of second pixel rows in the pixel array is greater than or equal to the first threshold value, determine that pixel data in the pixel array is lost, so as to determine that the pixel data in the image frame to be displayed is lost.

The number of first pixel rows is a number of pixel rows that fail to pass the CRC code check in the pixel array, and the number of second pixel rows is a total number of pixel rows in the pixel array.

In some embodiments, the one or more computer programs, when executed by the processor, cause the processor further to use replacement data corresponding to the pixel array as the data of the target pixels. For example, the target pixels are all or part of the pixels in the pixel array. For another example, the target pixels are all pixels in the image frame to be displayed.

In some embodiments, the replacement data corresponding to the pixel array includes data corresponding to pixels of a predetermined color, and/or, data used for displaying the mark of the pixels in the pixel array.

In some embodiments, the one or more computer programs, when executed by the processor, cause the processor further to: count a number of image frames in which the pixel data is continuously lost, determine whether a number of image frames in which the pixel data is continuously lost is greater than or equal to a second threshold value, and if the number of image frames in which the pixel data is continuously lost is greater than or equal to the second threshold value, use the preset replacement data as data of at least part of pixels in each image frame in which the pixel data is continuously lost.

In some embodiments, the one or more computer programs, when executed by the processor, cause the processor further to: detect a connection state of a target SDI, the target SDI being configured to transmit data of at least one pixel array of the image frame to be displayed; and if the target SDI is in an abnormal connection state, use the preset replacement data as the data of the at least one pixel array transmitted by the target SDI.

In the embodiments, the preset replacement data may be used as the data of the pixel array in the image frame to be displayed when it is detected that the pixel data in the image frame to be displayed is lost, thereby reminding the user that the pixel data in the image frame to be displayed is lost through the display effect of the processed images. Therefore, the SDI may be troubleshot, or the data links may be detected timely. In addition, since the replacement data corresponds to the pixel array, the above reminding may be more targeted. That is, it may be possible to clearly remind the user which link or which SDI has a fault, so that the user may conduct corresponding troubleshooting and maintenance. In this way, a situation where the pixel data in the image frame to be displayed is lost for a long time may be avoided.

For example, the non-transitory computer-readable storage medium may include, but is not limited to, a magnetic storage device (e.g., a hard disk, a floppy disk, or a tape), an optical disk (e.g., a compact disk (CD), and a digital versatile disk (DVD)), a smart card and a flash memory device (e.g., an erasable programmable read-only memory (EPROM), a card, a stick or a key drive). Various non-transitory computer-readable storage media described may represent one or more device, and/or other machine-readable storage media for storing information.

Some embodiments of the present disclosure further provide a computer program product. The computer program product includes one or more computer programs carried on a non-transitory computer-readable storage medium. When the one or more computer programs executed by a processor, cause the processor to perform the method provided in any of the embodiments of the present disclosure.

The beneficial effects of the computer program product are the same as the beneficial effects of the method described in any of the above embodiments, which will not be repeated here.

The foregoing descriptions are merely specific implementations of the present disclosure, but the protection scope of the present disclosure is not limited thereto. Changes or replacements that any person skilled in the art could conceive of within the technical scope of the present disclosure shall all be included in the protection scope of the present disclosure. Therefore, the protection scope of the present disclosure shall be subject to the protection scope of the claims.

What is claimed is:

1. A method for processing an image frame applied to an electronic device, the electronic device including a processor, a memory coupled to the processor and a display panel coupled to the processor; the method comprising:
    obtaining, by the processor, an image frame to be displayed;
    determining, by the processor, whether pixel data in the image frame to be displayed is lost;
    using, by the processor, preset replacement data as data of target pixels in the image frame to be displayed, in response to determining that the pixel data in the image frame to be displayed is lost;
    storing, by the memory, image frames to be displayed; and
    displaying, by the display panel, the image frames to be displayed;
    wherein the image frame to be displayed includes M pixel arrays, and M is an integer greater than 1; and determining whether the pixel data in the image frame to be displayed is lost includes:
    determining whether pixel data in each of the M pixel arrays is lost wherein determining whether the pixel data in each pixel array is lost includes:
    checking a cyclic redundancy check (CRC) code in data of each row of pixels in the pixel array;
    determining whether a ratio of a number of first pixel rows to a number of second pixel rows in the pixel array is greater than or equal to a first threshold value, wherein the number of first pixel rows is a number of pixel rows that fail to pass the CRC code check in the pixel array, and the number of second pixel rows is a total number of pixel rows in the pixel array; and
    determining that the pixel data in the pixel array is lost in response to determining that the ratio of the number of the first pixel rows to the number of the second pixel rows in the pixel array is greater than or equal to the first threshold value, so as to determine that the pixel data in the image frame to be displayed is lost.

2. The method according to claim 1, wherein pixels in each pixel array are marked using a same mark, and the image frame to be displayed is Obtained by arranging pixels in the M pixel arrays in a two-sample interleave manner.

3. The method according to claim 2, wherein using the preset replacement data as the data of the target pixels in the image frame to be displayed includes:
    using replacement data corresponding to the pixel array as the data of the target pixels, wherein the target pixels are all or part of pixels in the pixel array, or the target pixels are all pixels in the image frame to be displayed.

4. The method according to claim 3, wherein the replacement data corresponding to the pixel array includes data corresponding to pixels of a predetermined color and/or data used for displaying the mark of the pixels in the pixel array.

5. The method according to claim 1, further comprising:
    counting a number of image frames in which pixel data is continuously lost;
    determining whether the number of image frames in which the pixel data is continuously lost is greater than or equal to a second threshold value; and
    using preset replacement data as data of at least part of pixels in each image frame in which the pixel data is continuously lost, in response to determining that the number of image frames in which the pixel data is continuously lost is greater than or equal to the second threshold value.

6. An electronic device, comprising a processor, a memory coupled to the processor and a display panel coupled to the processor, wherein the processor is configured to: obtain an image frame to be displayed; determine whether pixel data in the image frame to be displayed is lost; and use preset replacement data as data of target pixels in the image frame to be displayed, in response to determining that the pixel data in the image frame to be displayed is lost; the memory is configured to store image frames to be displayed; and the display panel is configured to display image frames to be displayed, wherein the image frame to be displayed includes M pixel arrays, and M is an integer greater than 1; and the processor is configured to determine whether the pixel data in the image frame to be displayed is lost includes:
the processor is configured to determine whether pixel data in each of the M pixel arrays is lost, wherein the processor is configured to determine whether the pixel data in each pixel array is lost includes the processor is further configured to:
check a cyclic redundancy check (CRC) code in data of each row of pixels in the pixel array;
determine whether a ratio of a number of first pixel rows to a number of second pixel rows in a pixel array is greater than or equal to a first threshold value, wherein the number of first pixel rows is a number of pixel rows that fail to pass the CRC code check in the pixel array, and the number of second pixel rows is a total number of pixel rows in the pixel array; and
determine that the pixel data in the pixel array is lost in response to determining that the ratio of the number of the first pixel rows to the number of the second pixel rows in the pixel array is greater than or equal to the first threshold value, so as to determine that the pixel data in the image frame to be displayed is lost.

7. The electronic device according to claim 6, wherein pixels in each pixel array are marked using a same mark, and the image frame to be displayed is obtained by arranging pixels in the M pixel arrays in a two-sample interleave manner.

8. The electronic device according to claim 7, wherein the processor is configured to use the preset replacement data as the data of the target pixels in the image frame to be displayed includes the processor is configured to use replacement data corresponding to the pixel array as the data of the target pixels, wherein
the target pixels are all or part of pixels in the pixel array, or the target pixels are all pixels in the image frame to be displayed.

9. The electronic device according to claim 8, wherein the replacement data corresponding to the pixel array includes data corresponding to pixels of a predetermined color and/or data used for displaying the mark of the pixels in the pixel array.

10. The electronic device according to claim 6, wherein the processor is further configured to:
count a number of image frames in which pixel data is continuously lost;
determine whether the number of image frames in which the pixel data is continuously lost is greater than or equal to a second threshold value; and
use preset replacement data as data of at least part of pixels in each image frame in which the pixel data is continuously lost, in response to determining that the number of image frames in which the pixel data is continuously lost is greater than or equal to the second threshold value.

11. An electronic device, comprising a memory and a processor, wherein the memory stores a computer program that, when executed by the processor, causes the processor to perform the method for processing the image frame according to claim 1.

12. A non-transitory computer-readable storage medium storing a computer program that, when executed by a processor, causes the processor to perform the method for processing the image frame according to claim 1.

\* \* \* \* \*